(12) United States Patent
Shinoda (10) Patent No.: US 10,289,255 B2
(45) Date of Patent: ***May 14, 2019

(54) TOUCH SENSING DEVICE

(71) Applicant: HOSIDEN CORPORATION, Yao-shi, Osaka (JP)

(72) Inventor: Koji Shinoda, Yao (JP)

(73) Assignee: HOSIDEN CORPORATION, Yao-Shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/788,067

(22) Filed: Oct. 19, 2017

(65) Prior Publication Data

US 2018/0113532 A1  Apr. 26, 2018

(30) Foreign Application Priority Data

Oct. 25, 2016  (JP) ................................ 2016-208504

(51) Int. Cl.
*G06F 3/044* (2006.01)
*H03K 17/96* (2006.01)

(52) U.S. Cl.
CPC ........... *G06F 3/044* (2013.01); *H03K 17/962* (2013.01); *G06F 2203/04107* (2013.01); *G06F 2203/04111* (2013.01)

(58) Field of Classification Search
CPC ........... G06F 3/044; G06F 2203/04107; G06F 3/0412; G02F 1/13338; G09G 2300/0426
See application file for complete search history.

(56) References Cited

U.S. PATENT DOCUMENTS 9,122,357 B2    9/2015  Nakanishi et al.
9,870,109 B2 *  1/2018  Bulea ...................... G06F 3/044
(Continued)

FOREIGN PATENT DOCUMENTS

JP    2008197913 A    8/2008
JP    2015052818 A    3/2015
(Continued)

OTHER PUBLICATIONS

Extended European Search Report for European Application No. EP 17020478.8, published by the European Patent Office (EPO), dated Feb. 27, 2018, including corresponding Communication, 1-page Annex, Information on Search Strategy, and 4-page EPO Form 1703.

(Continued)

*Primary Examiner* — Sanjiv D. Patel
(74) *Attorney, Agent, or Firm* — Kilyk & Bowersox, P.L.L.C.

(57) ABSTRACT

A touch sensing device including first electrodes at a first height, and second electrodes and first ground electrodes at a second height. The first electrodes are spaced apart along a first direction and each include first and second overlapping portions. The second electrodes are spaced apart along a second direction and include pairs of adjacent second electrodes. The second electrodes each include wide and narrow portions. The wide portions are spaced apart in the first direction and include pairs of adjacent wide portions. Each narrow portion is smaller in the second direction than each wide portion and interconnects the corresponding adjacent wide portions. The narrow portions overlap the corresponding first overlapping portions. Each first ground electrode, located between the corresponding adjacent second electrodes, includes first and second portions. Each first portion is located between the corresponding wide portions.

(Continued)

Each second portion, located between the corresponding narrow portion, overlaps the corresponding second overlapping portions.

20 Claims, 6 Drawing Sheets

(56) References Cited

U.S. PATENT DOCUMENTS

| | | |
|---|---|---|
| 2008/0309633 A1 | 12/2008 | Hotelling et al. |
| 2009/0194344 A1* | 8/2009 | Harley .................. G06F 3/044 178/18.06 |
| 2009/0213090 A1* | 8/2009 | Mamba .................. G06F 3/044 345/174 |
| 2010/0110038 A1 | 5/2010 | Mo et al. |
| 2012/0075218 A1* | 3/2012 | Lin ...................... G06F 3/0418 345/173 |
| 2013/0088448 A1* | 4/2013 | Seo ..................... G06F 3/0488 345/173 |
| 2014/0035602 A1* | 2/2014 | Nagarajan ............. G06F 3/044 324/686 |
| 2014/0049271 A1* | 2/2014 | Trend ................ G01R 27/2605 324/663 |
| 2014/0347299 A1* | 11/2014 | Lu ......................... G06F 3/044 345/173 |
| 2015/0028894 A1* | 1/2015 | Sleeman ............... G06F 3/044 324/662 |
| 2015/0370368 A1 | 12/2015 | Yokohama et al. |

FOREIGN PATENT DOCUMENTS

| | | |
|---|---|---|
| JP | 2016009213 A | 1/2016 |
| WO | 2015025487 A1 | 2/2015 |

OTHER PUBLICATIONS

Notification of Reasons for Refusal (Office Action) for Japanese Patent Application No. 2016-208504 issued by the Japan Patent Office (JPO), dated Sep. 5, 2018, including English-language translation, 10 pages.

* cited by examiner

TOUCH SENSING DEVICE

CROSS-REFERENCE TO RELATED APPLICATION

The present application claims priority under 35 U.S.C. § 119 of Japanese Patent Application No. 2016-208504 filed on Oct. 25, 2016, the disclosure of which is expressly incorporated by reference herein in its entirety.

BACKGROUND OF THE INVENTION

Technical Field

The invention relates to touch sensing devices.

Background Art

U.S. Patent Application Publication No. US 2008/0309633 A1 discloses a conventional capacitive touch sensing device. The touch sensing device includes: a plurality of first electrodes arrayed at a first height position in spaced relation; and a plurality of second electrodes arrayed at a second height position in spaced relation and intersecting the first electrodes. The first and second height positions are different height positions.

SUMMARY OF INVENTION

The first electrodes and the second electrodes are electrostatically coupled at their intersections. When a detection target, such as a finger and a stylus, approaches one or more of the intersections, there are changes in electrostatic capacitance at the approached intersections. In response to an electrostatic capacitance changes, an output signal from the second electrode at the intersection changes. A detector IC, which is electrically connected to the second electrode, amplifies the output signal from the second electrode and determines whether or not a value of the output signal exceeds a threshold value.

If the detector IC amplifies the output signal from the second electrode to a large extent in order to improve detection sensitivity of the touch sensing device, the amplified output signal will exceed an upper limit value of the detector IC.

In the above circumstances, the invention provides a touch sensing device with enhanced detection sensitivity.

A touch sensing device of an aspect of the invention includes: a plurality of first electrodes, a plurality of second electrodes, and a plurality of first ground electrodes. The first electrodes are arrayed at a first height position in spaced relation along a first direction. The first electrodes each include a plurality of first overlapping portions and a plurality of second overlapping portions. The second electrodes are arrayed at a second height position in spaced relation along a second direction and intersect the first electrodes. The second height position is different from the first height position. The second direction intersects the first direction. The second electrodes include pairs of adjacent second electrodes, the adjacent second electrodes of each pair being located adjacent to each other in the second direction. The second electrodes each include a plurality of wide portions and a plurality of narrow portions. The wide portions are located at the second height position and spaced from each other in the first direction. The wide portions include pairs of adjacent wide portions, the adjacent wide portions of each pair being located adjacent to each other in the first direction. The narrow portions are located at the second height position. The narrow portions are each smaller in dimension in the second direction than each wide portion and interconnect the adjacent wide portions of a corresponding pair. The narrow portions of each second electrode overlap the corresponding first overlapping portions of the respective first electrodes. The first ground electrodes are each arranged at the second height position between the adjacent second electrodes of a corresponding pair so as to intersect the first electrodes. The first ground electrodes each include a plurality of first portions and a plurality of second portions. The first portions are each located at the second height position between the wide portions of the adjacent second electrodes of a corresponding pair leaving narrow clearances therefrom. The second portions are each located at the second height position between the narrow portions of the adjacent second electrodes of a corresponding pair leaving narrow clearances therefrom. The second portions overlap the corresponding second overlapping portions of the respective first electrodes.

The touch sensing device of this aspect provides improved detection sensitivity because of the following technical feature 1): The narrow portions of the second electrodes overlap the first overlapping portions of the first electrodes, i.e. the overlapping areas of the first electrodes and the second electrodes are relatively small. This technical feature 1) makes it possible to reduce the electrostatic capacitance at each intersection of the first and second electrodes. Accordingly, even if the touch sensing device is configured such that signals output either from the first electrodes or the second electrodes are input into the detector and amplified by the detector, a possibility is reduced that the amplified signals exceed the upper limit value set in the detector. This makes it possible to amplify signals output from the first or second electrodes to a maximum degree, resulting in improved sensitivity of the touch sensing device.

The first portions of each first ground electrode may include pairs of adjacent first portions. The adjacent first portions of each pair may be located adjacent to each other in the first direction and interconnected by a corresponding one of the second portions. The first ground electrodes may be grounded. This aspect of the invention also contributes to reduction of the electrostatic capacitance at each intersection of the first electrodes and the second electrodes because of the following technical feature 2): each of the second portions of the first ground electrodes is located between corresponding adjacent narrow portions of the second electrodes and overlaps a corresponding second overlapping portion of the first electrodes. In this arrangement, electric force lines proceed either from the second overlapping portions of the first electrodes or from the narrow portions of the second electrodes toward the second portions of the first ground electrodes. In other words, the second portions of the first ground electrodes can absorb the electric force lines either from the second overlapping portions of the first electrodes or from the narrow portions of the second electrodes toward the second portions of the first ground electrodes, resulting in reduced electrostatic capacitance at each intersection of the first electrodes and the second electrodes.

The touch sensing device of any aspect above may further include a second ground electrode. The second ground electrode may surround the second electrodes and the first ground electrodes and may be connected to the first ground electrodes. In the touch sensing device of this aspect, the first ground electrodes can be easily grounded via the second ground electrode.

The first electrodes may each include an electrode body. Each electrode body may have the first overlapping portions and the second overlapping portions and may extend in the second direction at the first height position. The first electrodes may each further include a plurality of first branches. The first branches may each extend at the first height position from a corresponding one of the first overlapping portions of the electrode body so as to overlap a part of one of the second electrodes that is next to said first overlapping portion.

The above technical features 1), or 1) and 2) may cause excessive reduction in electrostatic capacitance of each intersecting pair of first and second electrodes. Such excessive reduction is alleviated in the touch sensing device of the above aspect for the following reason. As each first branch overlaps a part of a corresponding second electrode, it is possible to enlarge the overlapping area of each intersecting pair of first and second electrodes and thereby adjust the electrostatic capacitance of the intersecting first and second electrodes to a desired value.

The first electrode may include a plurality of second branches in place of, or in addition to, the first branches. The second branches may each extend at the first height position from a corresponding one of the second overlapping portions of the electrode body so as to be located between two of the wide portions that are adjacent to each other in the second direction and that are located next to said second overlapping portion.

In the touch sensing device of this aspect, each second branch located between two adjacent wide portions will be electrostatically coupled to such wide portions. This arrangement leads to improved detection sensitivity in the vicinity of the second branches.

Each of the second portions of the first ground electrodes may be larger in dimension in the first direction than each of the first electrodes. In the touch sensing device of this aspect, the second portions of the first ground electrodes of the above-described size overlap the second overlapping portions of the first electrodes. This arrangement reduces electromagnetic interference with the first electrodes from the first-ground-electrode side.

The second branches of the first electrodes may each overlap a corresponding one of the first portions of the first ground electrode. Each of the first portions of the first ground electrodes may be larger in dimension in the second direction than each of the second branches of the first electrodes. In the touch sensing device of this aspect, the first portions of the first ground electrodes of the above-described size overlap the second branches of the first electrodes. This arrangement reduces electromagnetic interference with the first electrodes from the first-ground-electrode side.

The first electrodes may include pairs of adjacent first electrodes, the adjacent first electrodes of each pair being located adjacent to each other in the first direction. The touch sensing device may further include a plurality of dummy electrodes including a plurality of sets of dummy electrodes. The dummy electrodes of each set may be located at the first height position between two adjacent ones of the first electrodes leaving narrow clearances therefrom. In the touch sensing device of this aspect, the dummy electrodes partly overlap the second electrodes. This arrangement reduces electromagnetic interference with the second electrodes from the dummy-electrode side.

An electrostatic capacitance value of each intersecting pair of the first electrodes and the second electrodes may be in a range of 0.1 pF to 5 pF.

Each of the first branches extending from the corresponding first overlapping portions may overlap a part of one of the narrow portions that is overlapped by the same first overlapping portion. Alternatively, each of the first branches extending from the corresponding first overlapping portions may overlap a part of one of the narrow portions that is overlapped by the same first overlapping portion and may also overlap a part of one of the wide portions (110b) that is contiguous to the same narrow portion. Also, the first branches may include: a plurality of first branches that each extend from the corresponding first overlapping portions to one side of the first direction, and another plurality of first branches that each extend from the corresponding first overlapping portions to the other side of the first direction.

The second branches may include: a plurality of second branches that each extend from the corresponding second overlapping portions to one side of the first direction, and another plurality of second branches that each extend from the corresponding second overlapping portions to the other side of the first direction.

BRIEF DESCRIPTION OF DRAWINGS

The present invention can be even more fully understood with the reference to the accompanying drawings which are intended to illustrate, not limit, the present invention.

DESCRIPTION OF EMBODIMENTS

Figure 1A:
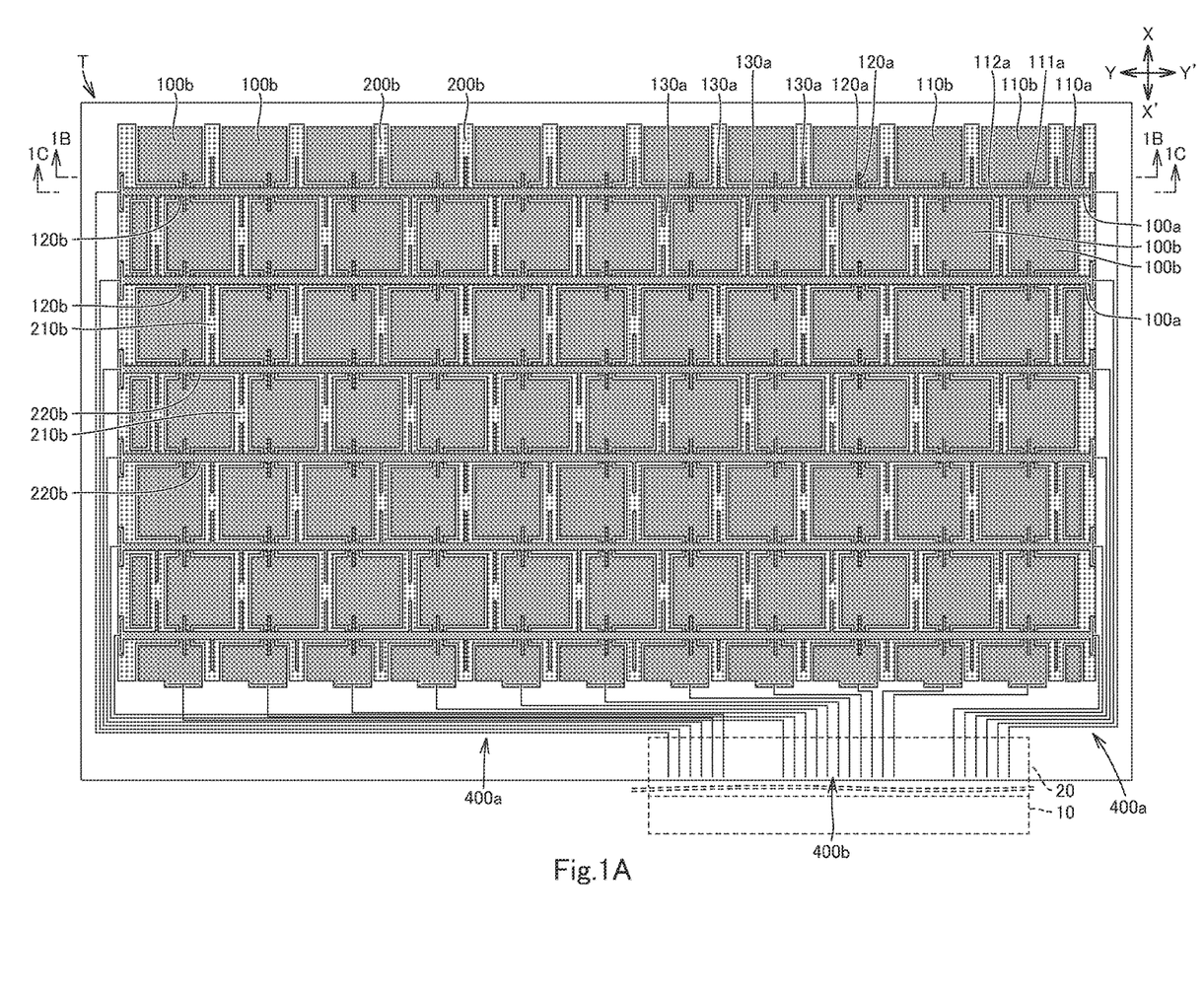
FIG. 1A is a schematic enlarged plan view of a touch sensing device according to a first embodiment of the invention, without showing peripheral ground electrodes.
Figure 1B:
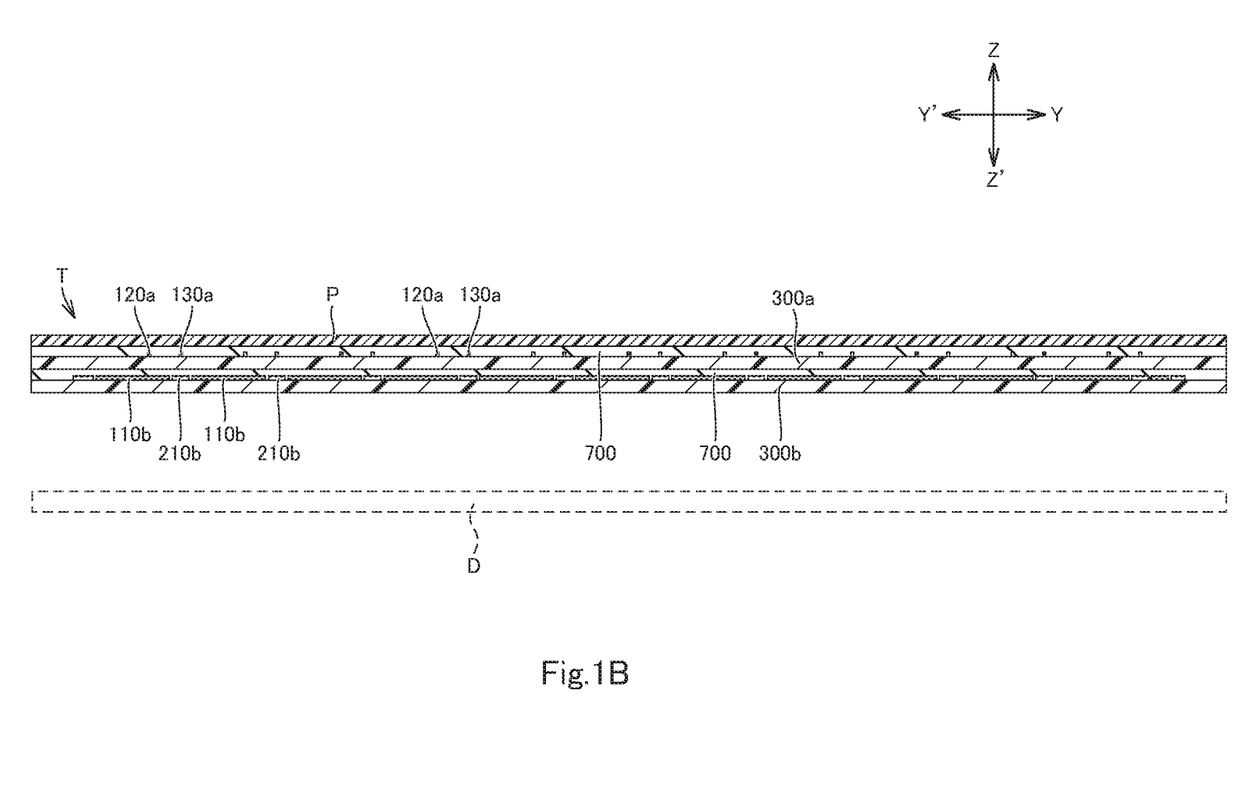
FIG. 1B is an enlarged intersect-sectional view of the touch sensing device of the first embodiment, which is taken along line 1B-1B in FIG. 1A and illustrates a positional relationship between the touch sensing device and an image display device.
Figure 1C:
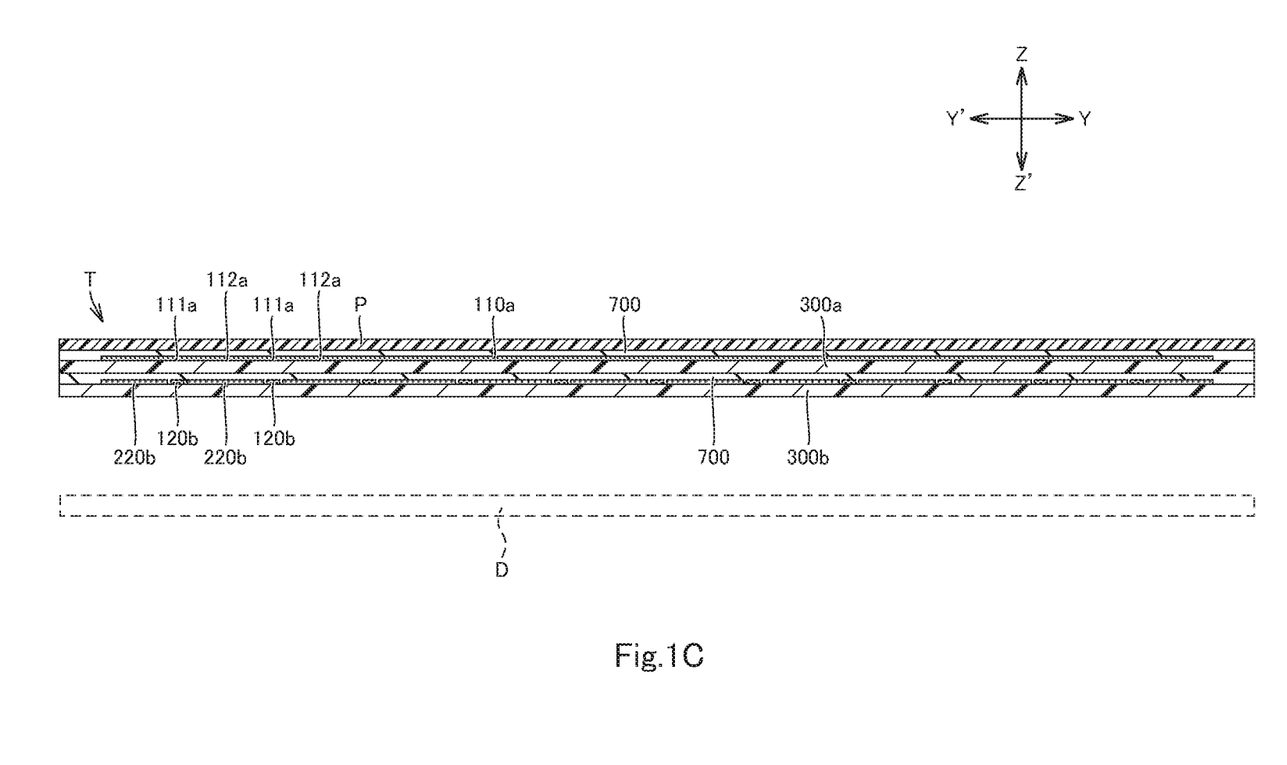
FIG. 1C is an enlarged intersect-sectional view of the touch sensing device of the first embodiment, which is taken along line 1C-1C in FIG. 1A and illustrates the positional relationship between the touch sensing device and the image display device.
Figure 2A:
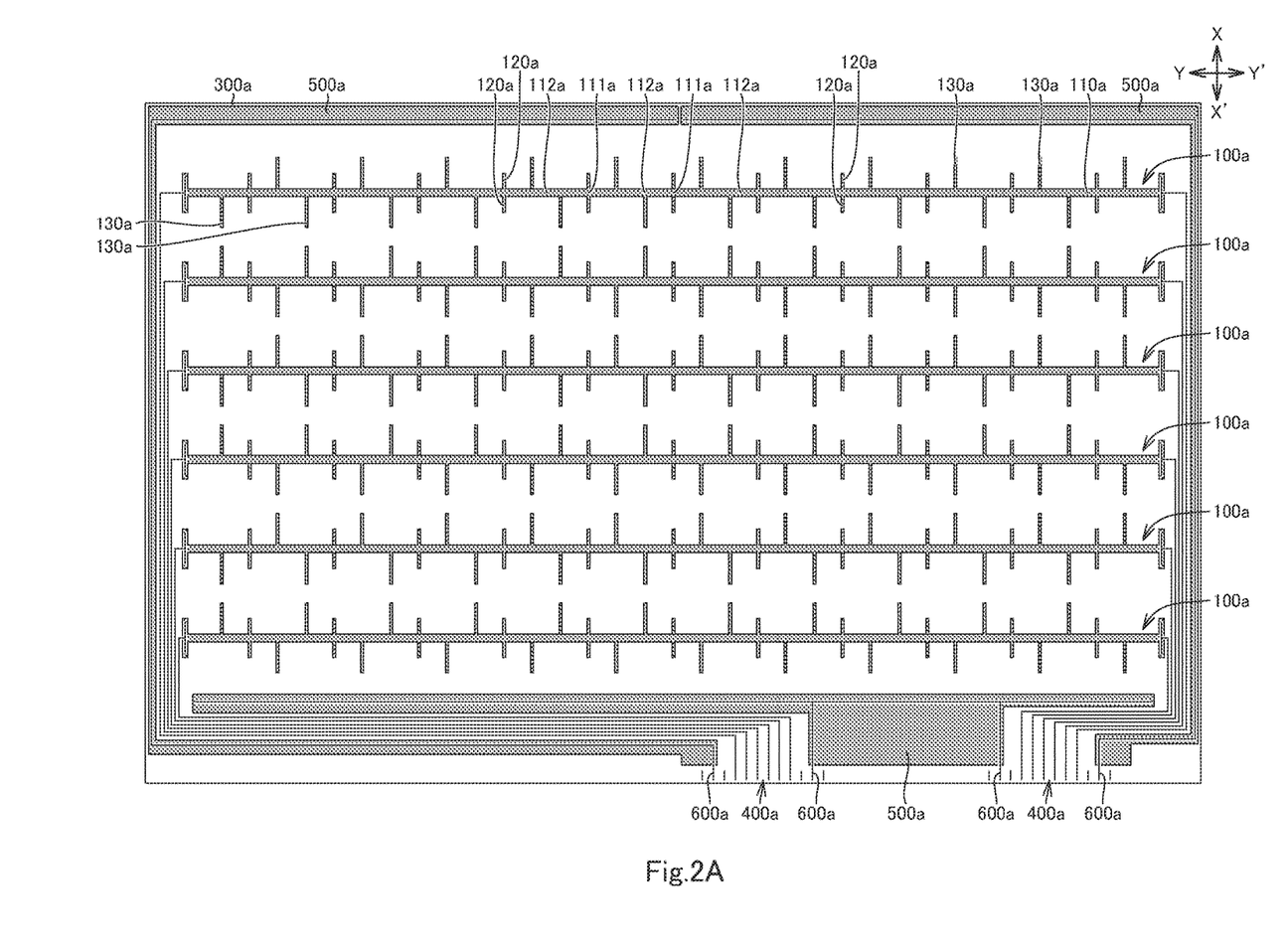
FIG. 2A is a schematic enlarged plan view of a first substrate of the touch sensing device according to the first embodiment, illustrating a positional relationship between first electrodes, first leads, and peripheral ground electrodes on the first substrate.
Figure 2B:
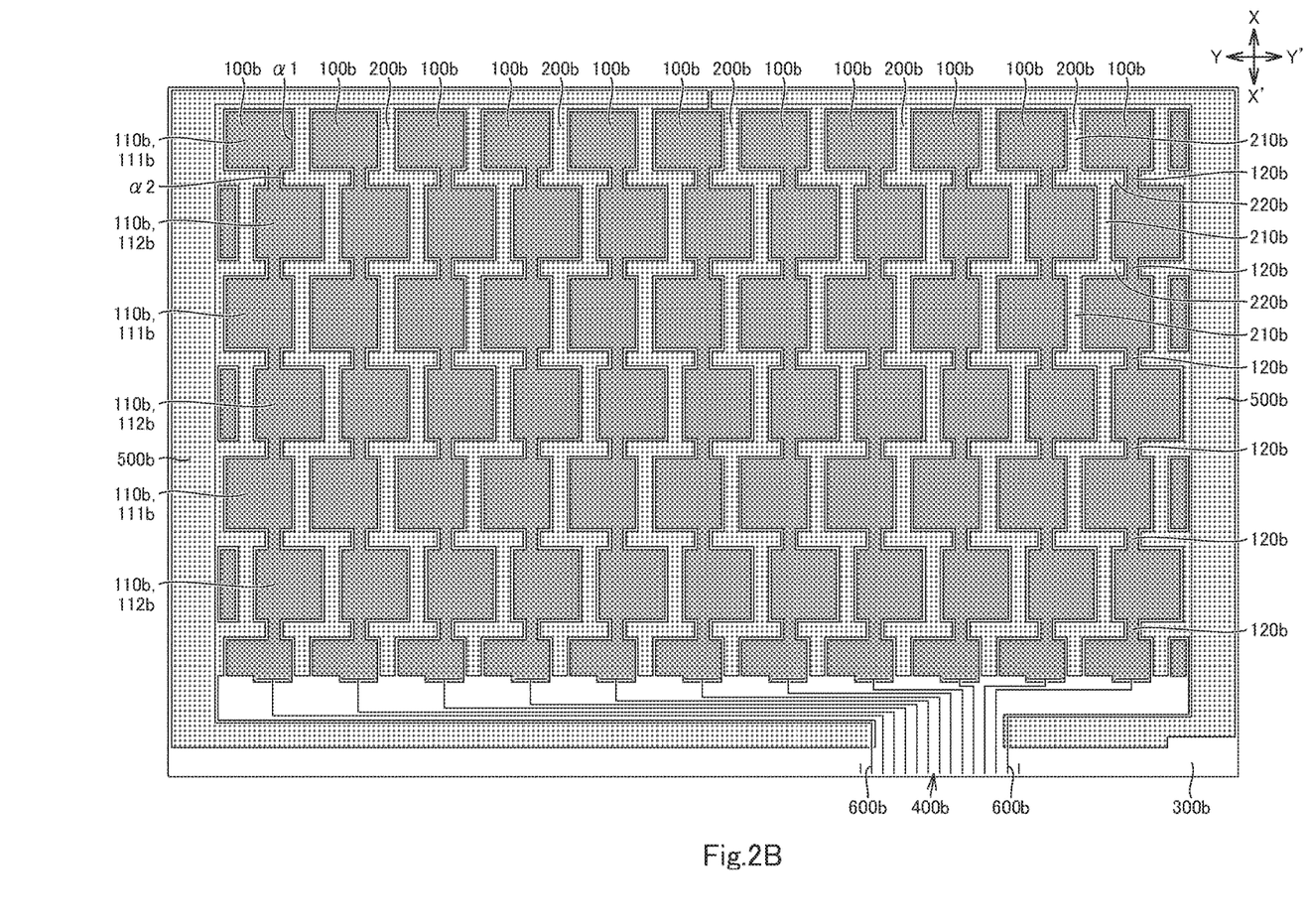
FIG. 2B is a schematic enlarged plan view of a second substrate of the touch sensing device according to the first embodiment, illustrating a positional relationship between second electrodes, ground electrodes, second leads, and peripheral ground electrodes on the second substrate.
Figure 3:
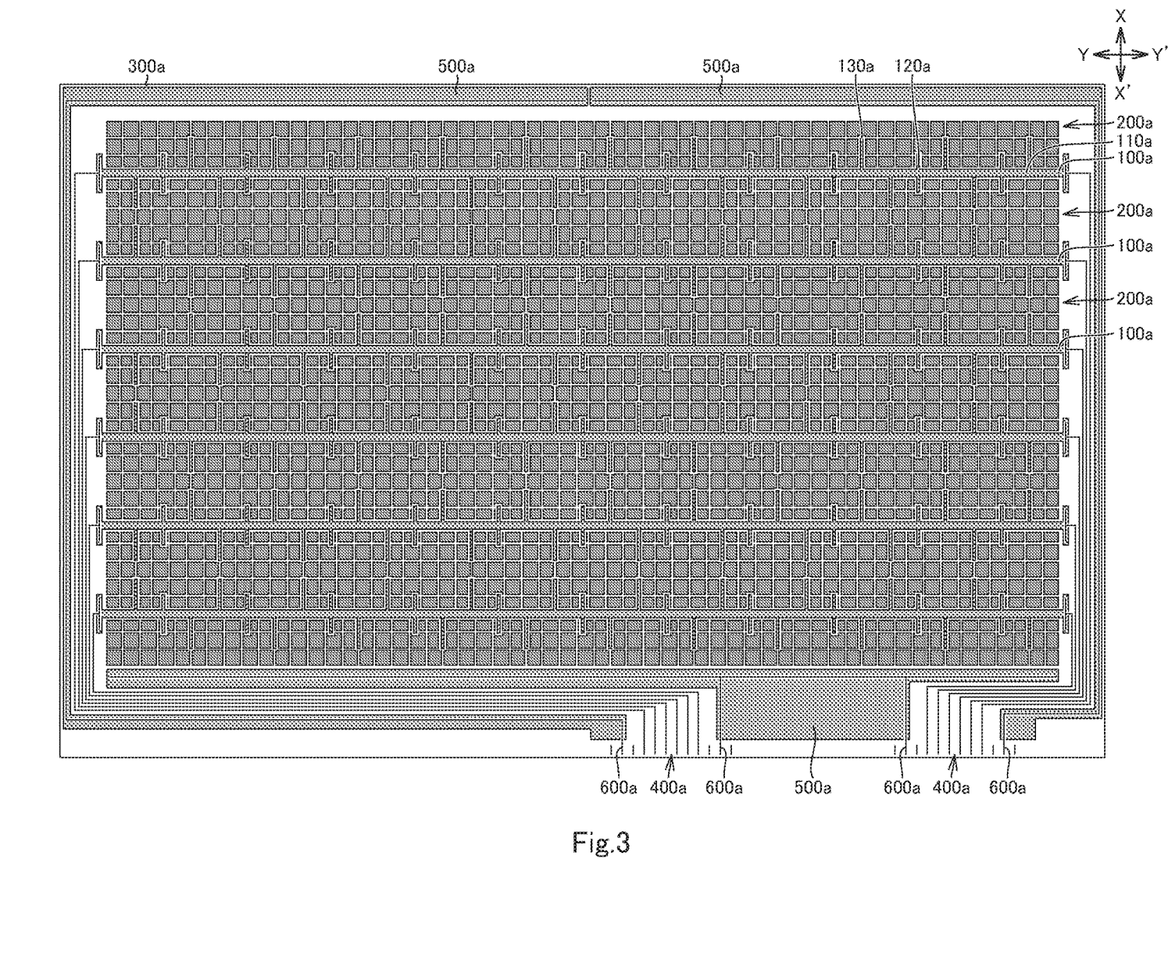
FIG. 3 is a view corresponding to FIG. 2A of a variant of the touch sensing device according to the first embodiment, illustrating a positional relationship between the first electrodes, the first leads, dummy electrodes, and peripheral ground electrodes on the first substrate.

A touch sensing device T according to the first and other embodiments of the invention will now be described with reference to FIG. 1A to FIG. 3. FIGS. 1A to 2B show the touch sensing device T of the first embodiment. FIG. 3 shows a variant of the touch sensing device T of the first embodiment. The X-X' direction indicated in FIGS. 1A, 2A, and 2B is the array direction of the first electrodes 100a of the touch sensing device T and corresponds to the first direction in the claims. In the X-X' direction, the X direction corresponds to one side of the first direction, and the X' direction corresponds to the other side of the first direction. The Y-Y' direction indicated in FIGS. 1A to 2B is the array direction of the second electrodes 100b of the touch sensing device T and corresponds to the second direction in the claims. The Y-Y' direction intersects the X-X' direction and may be perpendicular to the X-X' direction as shown in FIG. 1A to FIG. 2B. The Z-Z' direction indicated in FIGS. 1B and 1C is the thickness direction of the touch sensing device T. The Z-Z' direction is perpendicular to the X-X' and Y-Y' directions.

The touch sensing device T is a capacitive touch sensing device and may be disposed on the Z-direction side relative to an image display device D (on the light-emitting side of an image display device D). The touch sensing device T includes a plurality of first electrodes 100a, a plurality of second electrodes 100b, and a plurality of ground electrodes 200b (first ground electrodes). The first electrodes 100a may be detection electrodes (Tx electrodes), and the second electrodes 100b may be drive electrodes (Rx electrodes), as shown in FIG. 1A to FIG. 3. Alternatively, the first electrodes 100a may be drive electrodes (Rx electrodes), and the second electrodes 100b may be detection electrodes (Tx electrodes). It should be noted that FIG. 1A to FIG. 2B illustrate the first electrodes 100a, the second electrodes 100b, and the ground electrodes 200b with different halftone dot patterns, but such dots are not actual visual or physical dots but shown for the purpose of distinction only.

The first electrodes 100a, the second electrodes 100b, and the ground electrodes 200b are transparent conductive films or conductors. The transparent conductive films may be made of a material such as tin-doped indium oxide (ITO), carbon nanotubes (CNT), indium-doped zinc oxide (IZO), aluminum-doped zinc oxide (AZO), or conductive polymers such as PEDOT and PSS. The conductors may specifically be photosensitive silver, silver nanoink, silver nanowires, vapor-deposited copper, rolled copper, copper nanoink, etc.

The first electrodes 100a are arrayed at a first height position in spaced relation in the X-X' direction. The first electrodes 100a include pairs of "adjacent first electrodes" 100a. The adjacent first electrodes 100a of each pair are located adjacent to each other in the X-X' direction. The first electrodes 100a may generally extend in the Y-Y' direction. The second electrodes 100b are arrayed at a second height position in spaced relation in the Y-Y' direction so as to intersect the first electrodes 100a. The second electrodes 100b include pairs of "adjacent second electrodes" 100b. The adjacent second electrodes 100b of each pair are located adjacent to each other in the Y-Y' direction. The second electrodes 100b may generally extend in the X-X' direction. The ground electrodes 200b are arranged at the second height position, each between two of the second electrodes 100b leaving narrow clearances therefrom so as to intersect the first electrodes 100a. The ground electrodes 200b may generally extend in the X-X' direction. The first height position and the second height position may be different height positions from each other in the Z-Z' direction. The first height position may be on the Z-direction side relative to the second height position as shown in FIGS. 1B and 1C, but it is not limited thereto.

The touch sensing device T with the above-described arrangement of the first electrodes 100a, the second electrodes 100b and the ground electrodes 200b may specifically have one of the following configurations 1) to 3).

Configuration 1): As shown in FIGS. 1B to 1C, the touch sensing device T may further include a first substrate 300a and a second substrate 300b. The first substrate 300a and the second substrate 300b may each be a glass substrate or plastic film having a first face (the face facing the Z direction, hereinafter referred to as "Z-side face") and a second face (the face facing the Z' direction, hereinafter referred to as "Z'-side face"). The first substrate 300a and the second substrate 300b have enough optical transparency to allow a user to recognize visual information displayed by an image display device D through the first substrate 300a and the second substrate 300b. The first substrate 300a and the second substrate 300b may be entirely or partially transparent. As shown in FIG. 2A, the first electrodes 100a are arrayed in spaced relation along the X-X' direction on the first face of the first substrate 300a. As shown in FIG. 2B, the second electrodes 100b are arranged in spaced relation in the Y-Y' direction on the first face of the second substrate 300b. The ground electrodes 200b are arranged on the first face of the second substrate 300b, each between two of the second electrodes 100b leaving narrow clearances therefrom. The second face of the first substrate 300a and the first face of the second substrate 300b are bonded together with an adhesive layer 700. As a result, the first electrodes 100a intersect the second electrodes 100b and the ground electrodes 200b. In this configuration, the first face of the first substrate 300a is located and extends at the first height position, and the first face of the second substrate 300b is located and extends at the second height position. Also, the touch sensing device T may further include a cover panel P attached to the first face of the first substrate 300a with another adhesive layer 700 so as to cover the first electrodes 100a.

Configuration 2): The touch sensing device T may further include the first substrate 300a provided with the first electrodes 100a with the arrangement as described for the above configuration 1). The second electrodes 100b are arrayed in spaced relation along the Y-Y' direction on the second face of the first substrate 300a so as to intersect the first electrodes 100a. The ground electrodes 200b are arranged on the second face of the first substrate 300a, each between two of the second electrodes 100b leaving narrow clearances therefrom so as to intersect the first electrodes 100a. In this configuration, the first face of the first substrate 300a is located and extends at the first height position, and the second face of the first substrate 300a is located and extends at the second height position. Also, the touch sensing device T may further include a cover panel P attached to the first face of the first substrate 300a with another adhesive layer 700 so as to cover the first electrodes 100a.

Configuration: 3): The touch sensing device T may further include the second substrate 300b provided with the second electrodes 100b and the ground electrodes 200b, with the arrangement as described for the above configuration 1), and an insulating layer (not shown). The insulating layer is provided on the first face of the second substrate 300b so as to cover the second electrodes 100b and the ground electrodes 200b. The first electrodes 100a are arrayed in spaced relation along the X-X' direction on the face facing the Z direction ("Z-side face") of the insulating layer so as to intersect the second electrodes 100b and the ground electrodes 200b. In this configuration, the Z-side face of the insulating layer is located and extends at the first height position, and the first face of the second substrate 300b is located and extends at the second height position. Also, the touch sensing device T may further include a cover panel P attached to the first face of the second substrate 300b with another adhesive layer 700 so as to cover the first electrodes 100a, the second electrodes 100b, the ground electrodes 200*b* and the insulating layer. It should be noted that the above-described cover panel P may be omitted in any configuration 1) to 3).

Each of the first electrodes 100*a* includes an electrode body 110*a* extending in the Y-Y' direction. The electrode body 110 may be strip-shaped. Each electrode body 110*a* includes a plurality of first overlapping portions 111*a* and a plurality of second overlapping portions 112*a*. The second overlapping portions 112*a* are each located between two of the first overlapping portions 111*a*.

Each of the second electrodes 100*b* includes a plurality of wide portions 110*b* and a plurality of narrow portions 120*b*. Each narrow portion 120*b* is smaller in Y-Y' direction dimension than each wide portion 110*b*. Each wide portion 110*b* may have any outer shape, which may be, for example, a polygonal shape (rectangle in FIG. 1A to FIG. 3) or a circular shape. The wide portions 110*b* of each of second electrode 100*b* are located in spaced relation along the X-X' direction at the second height position and includes pairs of adjacent wide portions 110*b*. The adjacent wide portions 110*b* of each pair are adjacent to each other in the X-X' direction. The wide portions 110*b* do not overlap any electrode bodies 110*a* in the Z-Z' direction.

In each second electrode 100*b*, each narrow portion 120*b* interconnects two adjacent ones of the wide portions 110*b* that are adjacent to each other at the second height position, and overlaps a corresponding first overlapping portion 111*a* of the electrode body 110*a* of the first electrode 100*a* in the Z-Z' direction. Each narrow portion 120*b* and the corresponding first overlapping portion 111*a* are electrostatically coupled by overlapping each other. It should be appreciated that each overlapping area is relatively small, so that each intersecting pair of a first electrode 100*a* and a second electrode 100*b* accordingly exhibits a relatively small electrostatic capacitance value. Each narrow portion 120*b* may be larger in X-X' direction dimension than the electrode body 110*a* of each first electrode 100*a*. For example, each narrow portion 120*b* may be larger in X-X' direction dimension than each electrode body 110*a* by 30 μm or more.

Moreover, the wide portions 110*b* of each second electrode 100*b* may include a plurality of first wide portions 111*b* and a plurality of second-wide portions 112*b* alternately arrayed in spaced relation along the X-X' direction at the second height position and staggered in the Y-Y' direction. More specifically, the first and second-wide portions may be arranged as follows. Each first wide portion 111*b* includes a first region on the Y-direction side and a second region on the Y'-direction side, and each second-wide portion 112*b* also includes a first region on the Y'-direction side and a second region on the Y-direction side. It is preferable that in each second electrode 100*b*, the second regions of the first wide portions 111*b* coincide along the X-X' direction with the second regions of the second-wide portions 112*b*, and that each narrow portion 120*b* interconnect at the second height position the second region of a first wide portion 111*b* and the second region of a second-wide portion 112*b*. Each pair of the "adjacent second electrodes" 100*b* described above may be referred to as a pair of "one" and "the other" second electrodes 100*b*. In each pair, the first regions of the first wide portions 111*b* of the one second electrode 100*b* and the first regions of the second-wide portions 112*b* of the other second electrode 100*b* coincide along the X-X' direction. In an embodiment, each wide portion 110*b* does not to include the first wide portion 111*b* and the second-wide portion 112*b* as described above. In other words, the wide portions 110*b* of each second electrode 100*b* may be located in spaced relation linearly along the X-X' direction.

Each pair of the adjacent second electrodes 100*b* is provided with a plurality of first empty regions α1 and a plurality of second empty regions α2. The first empty regions α1 are defined by the wide portions 110*b* of the adjacent second electrodes 100*b*, i.e. each first empty regions α1 is defined by two wide portions 110*b* adjacent in the Y-Y' direction. The second empty regions α2, defined as described as definition i) or ii) below, are disposed on the Z'-direction side relative to the corresponding second overlapping portions 112*a* of the electrode bodies 110*a* of the first electrodes 100*a*. Definition i): the second empty regions α2 are defined by the narrow portions 120*b* of the adjacent second electrodes 100*b*, i.e. each second empty region α2 is defined by each set of two narrow portions 120*b* adjacent to each other in the Y-Y' direction ("paired narrow portions"). Definition ii): each second empty region α2 is defined by a set of the above-described paired narrow portions 120*b* and a set of "quaternary wide portions" 110*b*. Each set of quaternary wide portions" 110*b* consists of two wide portions 110*b* on the X-direction side, which are located on the X-direction side with respect to the paired narrow portions 120*b*, and two wide portions 110*b* on the X'-direction side, which are located on the X'-direction side with respect to the paired narrow portions 120*b*.

In each set of the quaternary wide portions 110*b* surrounding a second empty region α2, each wide portions 110*b* includes an intermediate portion connected to a narrow portion 120*b*, a first end portion on the Y-direction side relative to the intermediate portion, and a second end portion on the Y'-direction side relative to the intermediate portion. In each set of the quaternary wide portions 110*b*, the two wide portions 110*b* on the X-direction side are the combination of a wide portion 110*b* on the Y-direction side ("Y-side wide portion") and a wide portion 110*b* on the Y'-direction side ("Y'-side wide portion"). The second end portion of the Y-side wide portion 100*b* and the first end portion of the Y'-side wide portion 110*b* may preferably extend in the Y-Y' direction along, and directly on the X-direction side relative to, the corresponding second overlapping portion 112 of the first electrode 100*a*. The corresponding second overlapping portion 112 is located on the Z-direction side relative to the surrounded empty region α2. In this case, the second end portion of the Y-side wide portion 100*b* and the first end portion of the Y'-side wide portion 110*b* can be electrostatically coupled to the corresponding second overlapping portion 112. Also in each set of the quaternary wide portions 110*b*, the two wide portions 110*b* on the X'-direction side are the combination of a wide portion 110*b* on the Y-direction side ("another Y-side wide portion") and a wide portion 110*b* on the Y'-direction side ("another Y'-side wide portion"). The second end portion of the another Y-side wide portion 100*b* and the first end portion of the another Y'-side wide portion 110*b* may preferably extend in the Y-Y' direction along, and directly on X'-direction side relative to, the corresponding second overlapping portion 112 of the first electrode 100*a*. In this case, the second end portion of the another Y-side wide portion 100*b* and the first end portion of the another Y'-side wide portion 110*b* can be electrostatically coupled to the corresponding second overlapping portion 112.

The ground electrodes 200*b* each include a plurality of first portions 210*b* and a plurality of second portions 220*b*. In each ground electrode 200*b*, the first portions 210*b* are respectively disposed in the corresponding first empty regions a1 at the second height position. More specifically, each first portion 210*b* is located in the corresponding first empty regions α1, leaving narrow clearances from the wide portions 110b on the Y- and the Y'-direction sides relative to the first empty region α1. The second portions 220b are respectively disposed in the corresponding second empty regions α2 at the second height position and respectively overlap the corresponding second overlapping portions 112a of the electrode bodies 110a of the first electrodes 100a.

When the above definition i) is applied to the empty regions α2, each second portion 220b is arranged with narrow clearances from the paired narrow portions 120b described above. When the above definition ii) is applied to the empty regions α2, each second portion 220b is arranged with narrow clearances from the paired narrow portions 120b and the quaternary wide portions 110b described above.

In each of the ground electrodes 200b, the first portions 210b may include pairs of first portions 210b, the first portions 210 of each pair are located adjacent to each other in the X-X' direction and interconnected by a corresponding second portion 220b. In this case, the ground electrodes 200b may preferably be grounded but may be electrically floating.

If the ground electrodes 200b are grounded, and if each second portion 220b is disposed in the second empty region α2 leaving narrow clearances from the paired narrow portions 120b and overlaps the corresponding second overlapping portion 112a, electric force lines proceed either from the second overlapping portion 112a or from the narrow portions 120b toward the second portion 220b. In other words, each second portion 220b absorbs the electric force lines either from the second overlapping portion 112a or from the narrow portions 120b. Alternatively, if the ground electrodes 200b are grounded, each second portion 220b is disposed in the second empty region α2 leaving narrow clearances from the paired narrow portions 120b and from the quaternary wide portions 110b and overlaps the second overlapping portion 112a, electric force lines proceed either from the second overlapping portion 112a, or from the paired narrow portions 120b and the quaternary wide portions 110b, toward the second portion 220b. In other words, each second portion 220b absorbs the electric force lines either from the second overlapping portion 112a, or from the paired narrow portions 120b and the quaternary wide portions 110b. In any case, electrostatic capacitance decreases at each intersection of the first electrodes 100a and the second electrodes 100b.

Each clearance between each first portion 210b and the wide portions 110b of the adjacent second electrodes 100b may preferably, but not necessarily, be of size in the range of 10 μm to 100 μm. Also, each clearance between each second portion 220b and the paired narrow portions 120b may preferably, but not necessarily, be of size in the range of 10 μm to 100 μm, and that each clearance between each second portion 220b and the corresponding quaternary wide portions 110b may preferably, but not necessarily, be of size in the range of 10 μm to 100 μm.

In the region at the second height position for arranging the second electrodes 100b and the ground electrodes 200b (the region will be referred to as the "second electrode region"), the second electrodes 100b and the ground electrodes 200b may preferably occupy 90% to 99% of the second electrode region. In other words, the clearances between the second electrodes 100b and the ground electrodes 200b may preferably occupy 10% to 1% of the second electrode region. The second electrode region may be defined by the endmost second electrode 100b in the Y direction, the endmost second electrode 100b in the Y' direction, the X-direction ends of the second electrodes 100b, and the X'-direction ends of the second electrodes 100b. However, this is merely an example, and the second electrode region can be defined in any manner.

As shown in FIG. 1A and FIG. 2B, each first portion 210b may extend in the X-X' direction between corresponding two of the wide portions 110b. Each second portion 220b may extend in the Y-Y' direction between corresponding two of the narrow portions 120b. In other words, each second portion 220b may extend along a corresponding second overlapping portion 112a of the electrode body 110a of a corresponding one of the first electrodes 100a. Moreover, each second portion 220b may preferably, but not exclusively, be larger in Y-Y' direction dimension than each first portion 210b. Each second portion 220b may be larger in X-X' direction dimension than the electrode body 110a of each first electrode 100a. For example, each second portion 220b may be larger in X-X' direction dimension than the electrode body 110a of each first electrode 100a by 30 μm or more.

The first electrode 100a may further include a plurality of first branches 120a and/or a plurality of second branches 130a. Each first branch 120a extends at the first height position, in the X-X' direction from the X- or X'-direction end of the corresponding first overlapping portion 111a of an electrode body 110a. For convenience of explanation, a first branch 120a extending in the X direction from the X-direction end of a first overlapping portion 111a will be hereinafter referred to as an "X-side first branch" 120a, and a first branch 120a extending in the X' direction from the X'-direction end of a first overlapping portion 111a will be referred to as an "X'-side first branch" 120a.

Each X-side first branch 120a overlaps, in the Z-Z' direction, a part of the second electrode 100b that is next to, particularly directly on the X-direction side relative to, the corresponding first overlapping portion 111a. The "part" of the second electrode 100b may be a part of the narrow portion 120b overlapped by the corresponding first overlapping portion 111a, the part being on the X-direction side relative to the first overlapping portion 111a. Alternatively, as shown in FIG. 1A, the "part" of the second electrode 100b may be such part of the narrow portion 120b, plus the wide portion 110b that is contiguous to, and on the X-direction side relative to, said portion of the narrow portion 120b. Each X'-side first branch 120a overlaps, in the Z-Z' direction, a part of the second electrode 100b that is next to, particularly directly on the X'-direction side relative to, the corresponding first overlapping portion 111a. The "part" of the second electrode 100b may be a part of the narrow portion 120b overlapped by the corresponding first overlapping portion 111a, the part being on the X'-direction side relative to the first overlapping portion 111a. Alternatively, as shown in FIG. 1A, the "part" of the second electrode 100b may be such portion of the narrow portion 120b, plus the wide portion 110b that is contiguous to, and on the X'-direction side relative to, said portion of the narrow portion 120b.

If increasing the length (the X-X' direction dimension in FIGS. 1A and 2A) of each first branch 120a of a first electrode 100a and/or the width thereof (the Y-Y' direction dimension in FIGS. 1A and 2A), the area and accordingly its electrostatic capacitance is increased where the first electrode 100a intersects and overlaps each second electrode 100b. If decreasing the length and/or the width of each first branch 120a, the area and accordingly its electrostatic capacitance is decreased where the first electrode 100a intersects and overlaps each second electrode 100b. This means that adjusting and setting the length and/or width of each first branch 120a allows adjusting the electrostatic capacitance of each intersecting pair of first and second electrodes 100a and 100b to a desired value (for example, in a range of 0.1 pF to 5 pF).

Each second branch 130a extends at the first height position, in the X-X' direction from the X- or X'-direction end of the corresponding second overlapping portion 112a of an electrode body 110a. For convenience of explanation, a second branch 130a extending in the X direction from the X-direction end of a second overlapping portion 112a will be hereinafter referred to as a "X-side second branch" 130a, and a second branch 130a extending in the X' direction from the X'-direction end of a second overlapping portion 112a will be referred to as a "X'-side second branch" 130a.

Each X-side second branch 130a is located between two wide portions 110b that are adjacent to each other in the Y-Y' direction and located next to, particularly directly on the X-direction side relative to, the electrode body 110a connected to the second branch 130a. Each X'-side second branch 130a is located between two wide portions 110b that are adjacent to each other in the Y-Y' direction and located next to, particularly directly on the X'-direction side relative to, the electrode body 110a connected to the second branch 130a. Each, X-side or X'-side, second branch 130a between the corresponding two wide portions 110b overlaps the first portion 210b of the ground electrode 200b located between the same two wide portions 110b.

Each second branch 130a, located between the two wide portions 110b, can be electrostatically coupled to each of the two wide portions 110b. If increasing the length (the X-X' direction dimension in FIGS. 1A and 2A) of each second branch 130a and/or the width thereof (the Y-Y' direction dimension in FIGS. 1A and 2A), the distance is decreased between the second branch 130a and each of the two corresponding wide portions 110b, strengthening electrostatic coupling therebetween. If decreasing the length and/or the width of each second branch 130a, the distance is increased between the second branch 130a and each of the two corresponding wide portions 110b, weakening electrostatic coupling therebetween. This means that adjusting and setting the length and/or width of each second branch 130a allows improvement of the detection sensitivity near the second branch 130a. It should be noted that the first branches 120a and/or the second branches 130a may be omitted.

When each first electrode 100a includes the second branches 130a, the corresponding first portions 210b of the ground electrodes 200b may each be larger in Y-Y' direction dimension than each second branches 130a. For example, each corresponding first portions 210b may be larger in Y-Y' direction dimension than each second branches 130a by 30 μm or more.

The touch sensing device T may further include a plurality of first leads 400a and a plurality of second leads 400b. The first leads 400a are lead wires respectively connected to the electrode bodies 110a of the first electrodes 100a at the first height position. If the first electrodes 100a are arranged as described for the above configuration 1) or 2), the first leads 400a may preferably be provided on the first face of the first substrate 300a. If the first electrodes 100a are arranged as described for the above configuration 3), the first leads 400a may preferably be provided on the Z-side face of the insulating layer. The second leads 400b are lead wires respectively connected to the second electrodes 100b at the second height position. If the second electrodes 100b are arranged as described for the above configuration 1) or 3), the second leads 400b may preferably be provided on the first face of the second substrate 300b. If the second electrode 100b are arranged as described for the above configuration 2), the second leads 400b may preferably be provided on the second face of the first substrate 300a.

The first leads 400a and the second leads 400b may be connected to a detector 10 (e.g. a detector IC or the like). If connected, the leads 400a, 400b may be connected to the detector 10 directly or indirectly via an external connection member 20 (e.g. a flexible circuit board or the like). The external connection member 20 includes: a plurality of first connection lines connectable to the respective first leads 400a and a plurality of second connection lines connectable to the respective second leads 400b. The first and second connection lines are connected to the detector 10.

The detector 10 sequentially supplies driving pulses to the drive electrodes, amplifies signals (voltages or currents) sequentially output from the detection electrodes in response to the driving pulses, and determines whether or not the signals which have been amplified (hereinafter referred to as amplified signals) exceed a threshold value stored in a memory of the detector 10. When a detection target, such as a finger and a touch pen, approaches (or touches) any of points of the above-described electrostatic coupling between the first electrodes 100a and the second electrodes 100b, then an electrostatic capacitance at the approach point changes, and a signal output from the detection electrode at the approach point changes. When the detector 10 amplifying output signals from the detection electrodes determines that any of the amplified signal exceeds the threshold value, the detector 10 detects that a detection target has approached the point of electrostatic coupling between the drive electrode supplying the driving pulse and the detection electrode outputting the output signal. When sequentially supplying drive pulses to the drive electrodes, the detector 10 may preferably set each drive electrode, when not supplied with driving pulses (that is, when not driven), at the same level as that of the ground. Also, the memory of the detector 1 stores an upper limit value for amplified signals, and when any amplified signal exceeds the upper limit value, the detector 10 is brought into a saturated state.

The touch sensing device T may further include at least one peripheral ground electrode 500a and/or at least one peripheral ground electrode 500b. The peripheral ground electrode 500b corresponds to the second ground electrode as defined the claims. It should be noted that the peripheral ground electrodes 500a, 500b are omitted in FIG. 1A for convenience of illustration. However, FIG. 2A shows peripheral ground electrodes 500a, and FIG. 2B shows peripheral ground electrodes 500b. It should also be noted that FIGS. 2A and 2B illustrate the peripheral ground electrodes 500a, 500b with different half-tone dot patterns, but such dots are not actual visual or physical dots but shown for the purpose of distinction only.

As best shown in FIG. 2A, the at least one peripheral ground electrode 500a may preferably be disposed at the first height position so as to surround the first electrodes 100a. If the first electrode 100a are arranged as described for the above configuration 1) or 2), the at least one peripheral ground electrode 500a may preferably be provided on the first face of the first substrate 300a. If the first electrodes 100a are arranged as described for the above configuration 3), the at least one peripheral ground electrode 500a may preferably be provided on the Z-side face of the insulating layer. The first leads 400a may preferably be provided between the at least one peripheral ground electrode 500a and the first electrodes 100a. The at least one peripheral ground electrode 500a may be arranged so as to overlap the second leads 400b at least partly in the Z-Z' direction. In the first embodiment as shown in 1A to 2B, the at least one peripheral ground electrode 500a is provided in plurality.

As best shown in FIG. 2B, the at least one peripheral ground electrode 500b may preferably be disposed at the second height position so as to surround the second electrodes 100b and the ground electrodes 200b and connected to the ground electrodes 200b. In this case, the at least one peripheral ground electrode 500b and the ground electrodes 200b are formed from one transparent conductive film or conductor of a material as described above. If the second electrodes 100b and the ground electrodes 200b are arranged as described for the above configuration 1) or 3), the at least one peripheral ground electrode 500b may preferably be provided on the first face of the second substrate 300b. If the second electrodes 100b and the ground electrodes 200b arranged as described for the above configuration 2), the at least one peripheral ground electrode 500b may preferably be provided on the second face of the first substrate 300a. The second leads 400b may preferably be provided between the at least one peripheral ground electrode 500b and the second electrodes 100b. The at least one peripheral ground electrode 500b may be arranged so as to overlap the first leads 400a at least partly in the Z-Z' direction. In the first embodiment as shown in 1A to 2B, the at least one peripheral ground electrode 500b is provided in plurality. It is possible to omit the peripheral ground electrode 500a and/or the peripheral ground electrode 500b.

The touch sensing device T may further include at least one third lead 600a and/or at least one fourth lead 600b. The at least one third lead 600a may preferably be connected to the at least one peripheral ground electrode 500a. If the at least one peripheral ground electrode 500a is provided on the first face of the first substrate 300a, the at least one third lead 600a may preferably be also provided on the first face of the first substrate 300a. If the at least one peripheral ground electrode 500a is provided on the Z-side face of the insulating layer, the at least one third lead 600a may preferably be also provided on the Z-side face of the insulating layer.

The at least one fourth lead 600b may preferably be connected to the at least one peripheral ground electrode 500b. If the at least one peripheral ground electrode 500b is provided on the first face of the second substrate 300b, the at least one fourth lead 600b may preferably be also provided on the first face of the second substrate 300b. If the at least one peripheral ground electrode 500b is provided on the second face of the first substrate 300a, the at least one fourth lead 600b may preferably be also provided on the second face of the first substrate 300a. The third lead 600a and the fourth lead 600b are also connectable to the detector 10 directly or indirectly via the external connection member 20. It is possible to omit the at least one third lead 600a and/or the at least one fourth lead 600b.

FIG. 3 shows another embodiment of the touch sensing device T, which further includes a plurality of dummy electrodes 200a. It should be noted that FIG. 3 illustrates the first electrodes 100a, the dummy electrodes 200a, and the peripheral ground electrode 500a with different half-tone dot patterns, but such dots are not actual visual or physical dots but shown for the purpose of distinction only.

The dummy electrodes 200a include a plurality of sets of dummy electrodes 200a. The dummy electrodes 200a of each set are arrayed at the first height position, between two adjacent ones of the first electrodes 100a leaving narrow clearances from each other and from each of these two first electrodes 100a. If the first electrodes 100a are arranged as described for the above configuration 1) or 2), the dummy electrodes 200a may preferably be provided on the first face of the first substrate 300a. If the first electrodes 100a are arranged as described for the above configuration 3), the dummy electrodes 200a may preferably be provided on the Z-side face of the insulating layer.

In the region at the first height position for arranging the first electrodes 100a and the dummy electrodes 200a (the region will be referred to as the "first electrode region"), the first electrodes 100a and the dummy electrodes 200a may preferably occupy 80% to 99% of the first electrode region. In other words, the clearances between the first electrodes 100a and the dummy electrodes 200a and between the dummy electrodes 200a may preferably occupy 20% to 1% of the first electrode region. The first electrode region may be defined by the Y-direction ends of the first electrodes 100a, the Y'-direction ends of the first electrodes 100a, the dummy electrodes 200a at the end most row in the X direction, and the dummy electrodes 200a at the end most row in the X' direction. However, this definition is merely an example, and the first electrode region can be defined in any manner. The dummy electrodes 200a may be omitted.

The touch sensing device T as described above has at least the following technical features and effects. First, the touch sensing device T exhibit improved detection sensitivity for the following reasons. 1) The narrow portions 120b of the second electrodes 100b overlap the first overlapping portions 111a of the first electrodes 100a, i.e. the overlapping areas of the first electrodes 100a and the second electrodes 100b are relatively small. 2) The ground electrodes 200b, if grounded, are arranged in a manner 2-1) or 2-2). 2-1) The second portions 220b of the ground electrodes 200b are each located in a corresponding second empty region α2 leaving narrow clearances from corresponding paired narrow portions 120b and each overlap a corresponding second overlapping portion 112a. In this arrangement, electric force lines proceed either from the second overlapping portion 112a or from the narrow portions 120b toward the second portion 220b. In other words, each second portion 220b absorbs the electric force lines either from the second overlapping portion 112a or from the narrow portions 120b. 2-2) The second portions 220b of the ground electrodes 200b are each disposed in a corresponding second empty region α2 leaving narrow clearances from corresponding paired narrow portions 120b and from corresponding quaternary wide portions 110b and each overlap a corresponding second overlapping portion 112a. In this arrangement, electric force lines proceed either from the second overlapping portion 112a, or from the paired narrow portions 120b, toward the second portion 220b; and electric force lines proceed either from the second overlapping portion 112a, or from the quaternary wide portions 110b, toward the second portion 220b. In other words, each second portion 220b absorbs the electric force lines either from the second overlapping portion 112a or from the paired narrow portions 120b, and also absorbs electric force lines either from the second overlapping portion 112a or from the quaternary wide portions 110b. The above technical features 1), 1) and 2-1), or 1) and 2-2) make it possible to reduce the electrostatic capacitance at each intersection of the first electrodes 100a and the second electrodes 100b. Accordingly, even if the touch sensing device T is configured such that signals output either from the first electrodes 100a or the second electrodes 100b are input into the detector 10 and amplified by the detector 10, a possibility is reduced that the amplified signals exceed the upper limit value set in the detector 10. This makes it possible to amplify signals output from the first or second electrodes to a maximum degree, resulting in improved sensitivity of the touch sensing device T.

Second, the first portions 210b of the ground electrodes 200b are each arranged between the wide portions 110b of corresponding two adjacent ones of the second electrodes 100b. This arrangement reduces the electrostatic coupling between the wide portions 110b of the two adjacent second electrodes 100b.

Third, the touch sensing device T allows each intersecting pair of first and second electrodes 100a and 100b to exhibit a desired value. Particularly, the above technical features 1), 1) and 2-1), or 1) and 2-2) may cause excessive reduction in electrostatic capacitance of each intersecting pair of first and second electrodes 100a and 100b. However, the electrostatic capacitance can be increased if the first electrodes 100a each include the first branches 120a. By adjusting and setting the length and/or width of each first branch 120a, it is possible to enlarge the overlapping area of each intersecting pair of first and second electrodes 100a and 100b and thereby adjust the electrostatic capacitance of the intersecting first and second electrodes 100a and 100b to a desired value.

Fourth, the touch sensing device T allows fine adjustments of the sensitivity. Particularly, if the second portions 220b are arranged with the above technical features 2-2) so as to each absorb electric force lines either from the corresponding set of the quaternary wide portions 110b or from the corresponding second overlapping portion 112a, sensitivity at this portion may be lower than sensitivity at the portion including (the intersection of) each narrow portion 120b of the second electrodes 100b and each first overlapping portion 111a of the first electrodes 100a. However, if each of the first electrodes 100a includes the second branches 130a, each second branch 130a is electrostatically coupled to at least two of the quaternary wide portions 110b, resulting in improved sensitivity around each second branch 130a. It is also possible to match the sensitivity around each second branch 130a with the sensitivity at each intersection described above, by adjusting and setting the length and/or width of each second branch 130a.

Fifth, the touch sensing device T has a high degree of flexibility in wiring the second leads 400b. If the ground electrodes 200b are connected to the peripheral ground electrode 500b, it eliminates extra wiring for grounding the ground electrodes 200b.

Sixth, the touch sensing device T is resistant to electromagnetic interference from the Z' direction side, such as interference of noise from an image display device D, for the following reasons. i) If each narrow portion 120b of the second electrodes 100b and each second portion 220b of the ground electrode 200b are larger in X-X' direction dimension than the electrode body 110a of each first electrode 100a, the narrow portions 120b of the second electrodes 100b and the second portions 220b of the ground electrodes 200b cover corresponding electrode bodies 110a from the Z' direction. Hence, the narrow portions 120b of the second electrodes 100b and the second portions 220b of the ground electrodes 200b serve to reduce electromagnetic interference with the electrode bodies 110a of the first electrodes 100a from the Z' direction. ii) If each of the first electrodes 100a includes the second branches 130a, the ground electrodes 200b can be configured such that each first portion 210b of the ground electrodes 200b is larger in Y-Y' direction dimension than each second branch 130a of the first electrode 100a. This configuration allows the first portions 210b of the ground electrodes 200b to cover corresponding second branches 130a of the first electrodes 100a from the Z'-direction side. Hence, the first portions 210b of the ground electrodes 200b serve to reduce electromagnetic interference with the second branches 130a from the Z' direction side. iii) If the second electrodes 100b and the ground electrodes 200b occupy 90% to 99% of the second electrode region at the second height position, this means that most of the area of the second electrode region is occupied with the second electrodes 100b and the ground electrodes 200b. In this case, the second electrodes 100b and the ground electrodes 200b serve to reduce electromagnetic interference with the first electrodes 100a from the Z' direction side. It should be noted that the sixth technical features and effects are enhanced if the detector 10 is configured to set each second electrode 100b, when not driven, at the same level as that of the ground.

Seventh, it is possible to reduce a possibility of distortion in the substrate provided with the second electrodes 100b and the ground electrodes 200b for the following reasons. In a touch sensing device of a comparative example (not shown) having a substrate provided with electrodes of reed/strip shape, an area without an electrode alternates with an area with an electrode within the substrate. This may cause differences in thermal expansion and/or thermal contraction of the substrate between areas with electrodes and areas without electrodes, which may result in deformation of the substrate in accordance with the shapes of the electrodes. This is in contrast with the touch sensing device T, the second electrodes 100b each include the wide portions 110b and the narrow portions 120b, and the ground electrodes 200b are each between adjacent two of the second electrodes 100b, so that the substrate provided with the second electrodes 100b and the ground electrodes 200b is rendered resistant to distortion. Moreover, if 90% to 99% of the second electrode region is occupied with the second electrodes 100b and the ground electrodes 200b, there is almost no area in the second electrode region that is not occupied with any second electrodes 100b or any ground electrodes 200b, so that the substrate provided with the second electrodes 100b and the ground electrodes 200b rendered resistant to distortion. Similarly, to the second electrode region, if 80% to 99% of the first electrode region is occupied with the first electrodes 100a and the dummy electrodes 200a, the substrate provided with the first electrodes 100a and the dummy electrodes 200a rendered resistant to distortion.

Eighth, the touch sensing device T is further resistant to electromagnetic interference from the Z direction side, such as interference of noise from outside of the touch sensing device T, if the touch sensing device T includes the dummy electrodes 200a. The eighth technical feature and effect are improved if 80% to 99% of the first electrode region is occupied with the first electrodes 100a and the dummy electrodes 200a.

It should be noted that the touch sensing device of the invention is not limited to the embodiments described above but may be modified in any manner within the scope of the claims. Some modification examples will be described below.

At least one third substrate may be provided between the first substrate and the second substrate of the invention.

The first leads of the invention may be provided at a height position different from the first height position. In this case, the first leads may preferably be connected to the respective first electrodes via first connecting means, such as throughhole electrodes in a substrate. The second leads of the invention may be provided at a height position different from the second height position. In this case, the second leads may preferably be connected to the respective second electrodes via second connecting means, such as throughhole electrodes in a substrate. Also, the first electrodes and/or the second electrodes of the invention may be connected to other connecting means, such as pins and at least one cable, in place of the first leads and/or the second leads. The third and/or the fourth leads may be modified in various manners similarly to the first leads and other parts of the invention.

The touch sensing device of the invention may be curved at least partly. In this case, the first height position of the invention may be a position on the first face of the first substrate 300*a* that is at least partially curved or a position on the Z-side face of the insulating layer that is at least partially curved. Likewise, the second height position of the invention may be a position on the first face of the second substrate 300*b* that is at least partially curved or a position on the second face of the first substrate 300*a* that is at least partially curved.

It should be appreciated that the materials, the shapes, the dimensions, the number, the positions, etc. of the elements of the touch sensing devices in the above-described embodiments and their variants are presented by way of example only and can be modified in any manner as long as the same functions can be fulfilled. The aspects and variants of the above-described embodiments can be combined in any possible manner. The first direction of the invention may be any direction along which the first electrodes of the invention are arrayed. The second direction of the invention may be any direction intersecting the first direction. The Z-Z' direction (third direction) of the invention may be any direction that intersects the first and second directions and that is located on a different plane from the plane where the first and second directions are located.

The entire contents of all references cited in this disclosure are incorporated herein in their entireties, by reference. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether such ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

REFERENCE SIGNS LIST

T: touch sensing device
100*a*: first electrode
110*a*: electrode body
111*a*: first overlapping portion
112*a*: second overlapping portion
120*a*: first branch
130*a*: second branch
100*b*: second electrode
110*b*: wide portion
111*b*: first wide portion
112*b*: second-wide portion
120*b*: narrow portion
200*a*: dummy electrode
200*b*: ground electrode (first ground electrode)
210*b*: first portion
220*b*: second portion
300*a*: first substrate
300*b*: second substrate
400*a*: first lead
400*b*: second lead
500*a*: peripheral ground electrode
500*b*: peripheral ground electrode (second ground electrode)
600*a*: third lead
600*b*: fourth lead
700: adhesive layer
P: cover panel
10: detector
20: external connection member
D: image display device

What is claimed is:

1. A touch sensing device comprising:
a plurality of first electrodes arrayed at a first height position in spaced relation along a first direction, the first electrodes each including a plurality of first overlapping portions and a plurality of second overlapping portions;
a plurality of second electrodes arrayed at a second height position in spaced relation along a second direction and intersect the first electrodes, the second height position being different from the first height position, the second direction intersecting the first direction, the second electrodes including pairs of adjacent second electrodes, the adjacent second electrodes of each pair being located adjacent to each other in the second direction, and the second electrodes each including:
a plurality of wide portions being located at the second height position and spaced from each other in the first direction and including pairs of adjacent wide portions, the adjacent wide portions of each pair being located adjacent to each other in the first direction, and
a plurality of narrow portions being located at the second height position, the narrow portions each being smaller in dimension in the second direction than each wide portion and interconnecting the adjacent wide portions of a corresponding pair, and the narrow portions of each second electrode overlapping the corresponding first overlapping portions of the respective first electrodes; and
a plurality of first ground electrodes each being arranged at the second height position between the adjacent second electrodes of a corresponding pair so as to intersect the first electrodes, the first ground electrodes each including:
a plurality of first portions each located at the second height position between the wide portions of the adjacent second electrodes of a corresponding pair leaving narrow clearances therefrom; and
a plurality of second portions each located at the second height position between the narrow portions of the adjacent second electrodes of a corresponding pair leaving narrow clearances therefrom, the second portions overlapping the corresponding second overlapping portions of the respective first electrodes; wherein
the wide portions of each of the second electrodes are staggered in the second direction, and the first portions of each of the first ground electrodes are staggered in the second direction and include pairs of first portions, the first portions of each pair being located adjacent to each other in the first direction and interconnected by a corresponding one of the second portions.

2. The touch sensing device according to claim 1, wherein
the first portions of each first ground electrode include pairs of adjacent first portions, the adjacent first portions of each pair being located adjacent to each other in the first direction and interconnected by a corresponding one of the second portions, and
the first ground electrodes are grounded.

3. The touch sensing device according to claim 2, further comprising: a second ground electrode surrounding the second electrodes and the first ground electrodes and being connected to the first ground electrodes.

4. The touch sensing device according to claim 1, wherein
the first electrodes each include an electrode body, the electrode body having the first overlapping portions and the second overlapping portions and extending in the second direction at the first height position.

5. The touch sensing device according to claim 2, wherein
the first electrodes each include an electrode body, the electrode body having the first overlapping portions and the second overlapping portions and extending in the second direction at the first height position.

6. The touch sensing device according to claim 4, wherein the first electrodes each further include a plurality of first branches, the first branches each extending at the first height position from a corresponding one of the first overlapping portions of the electrode body so as to overlap a part of one of the second electrodes that is next to said first overlapping portion.

7. The touch sensing device according to claim 4, wherein
the first electrodes each further include a plurality of second branches, the second branches each extending at the first height position from a corresponding one of the second overlapping portions of the electrode body so as to be located between two of the wide portions that are adjacent to each other in the second direction and that are located next to said second overlapping portion.

8. The touch sensing device according to claim 1, wherein each of the second portions of the first ground electrodes is larger in dimension in the first direction than each of the first electrodes.

9. The touch sensing device according to claim 2, wherein each of the second portions of the first ground electrodes is larger in dimension in the first direction than each of the first electrodes.

10. The touch sensing device according to claim 3, wherein each of the second portions of the first ground electrodes is larger in dimension in the first direction than each of the first electrodes.

11. A touch sensing device comprising:
a plurality of first electrodes arrayed at a first height position in spaced relation along a first direction, the first electrodes each including a plurality of first overlapping portions and a plurality of second overlapping portions;
a plurality of second electrodes arrayed at a second height position in spaced relation along a second direction and intersect the first electrodes, the second height position being different from the first height position, the second direction intersecting the first direction, the second electrodes including pairs of adjacent second electrodes, the adjacent second electrodes of each pair being located adjacent to each other in the second direction, and the second electrodes each including:
a plurality of wide portions being located at the second height position and spaced from each other in the first direction and including pairs of adjacent wide portions, the adjacent wide portions of each pair being located adjacent to each other in the first direction, and
a plurality of narrow portions being located at the second height position, the narrow portions each being smaller in dimension in the second direction than each wide portion and interconnecting the adjacent wide portions of a corresponding pair, and the narrow portions of each second electrode overlapping the corresponding first overlapping portions of the respective first electrodes; and
a plurality of first ground electrodes each being arranged at the second height position between the adjacent second electrodes of a corresponding pair so as to intersect the first electrodes, the first ground electrodes each including:
a plurality of first portions each located at the second height position between the wide portions of the adjacent second electrodes of a corresponding pair leaving narrow clearances therefrom; and
a plurality of second portions each located at the second height position between the narrow portions of the adjacent second electrodes of a corresponding pair leaving narrow clearances therefrom, the second portions overlapping the corresponding second overlapping portions of the respective first electrodes; wherein
the first electrodes each include an electrode body, the electrode body having the first overlapping portions and the second overlapping portions and extending in the second direction at the first height position,
the first electrodes each further include a plurality of second branches, the second branches each extending at the first height position from a corresponding one of the second overlapping portions of the electrode body so as to be located between two of the wide portions that are adjacent to each other in the second direction and that are located next to said second overlapping portion,
the second branches of the first electrodes each overlap a corresponding one of the first portions of the first ground electrode, and
each of the first portions of the first ground electrodes is larger in dimension in the second direction than each of the second branches of the first electrodes.

12. The touch sensing device according to claim 1, wherein
the first electrodes include pairs of adjacent first electrodes, the adjacent first electrodes of each pair being located adjacent to each other in the first direction,
the touch sensing device further comprises a plurality of dummy electrodes including a plurality of sets of dummy electrodes, and
the dummy electrodes of each set are located at the first height position between two adjacent ones of the first electrodes leaving narrow clearances from each of the two first electrodes.

13. The touch sensing device according to claim 1, wherein an electrostatic capacitance value of each intersecting pair of the first electrodes and the second electrodes is in a range of 0.1 pF to 5 pF.

14. A touch sensing device comprising:
a plurality of first electrodes arrayed at a first height position in spaced relation along a first direction, the first electrodes each including a plurality of first overlapping portions and a plurality of second overlapping portions;
a plurality of second electrodes arrayed at a second height position in spaced relation along a second direction and intersect the first electrodes, the second height position being different from the first height position, the second direction intersecting the first direction, the second electrodes including pairs of adjacent second electrodes, the adjacent second electrodes of each pair being located adjacent to each other in the second direction, and the second electrodes each including:
a plurality of wide portions being located at the second height position and spaced from each other in the first direction and including pairs of adjacent wide portions, the adjacent wide portions of each pair being located adjacent to each other in the first direction, and
a plurality of narrow portions being located at the second height position, the narrow portions each being smaller in dimension in the second direction than each wide portion and interconnecting the adjacent wide portions of a corresponding pair, and the narrow portions of each second electrode overlapping the corresponding first overlapping portions of the respective first electrodes; and
a plurality of first ground electrodes each being arranged at the second height position between the adjacent second electrodes of a corresponding pair so as to intersect the first electrodes, the first ground electrodes each including:
a plurality of first portions each located at the second height position between the wide portions of the adjacent second electrodes of a corresponding pair leaving narrow clearances therefrom; and
a plurality of second portions each located at the second height position between the narrow portions of the adjacent second electrodes of a corresponding pair leaving narrow clearances therefrom, the second portions overlapping the corresponding second overlapping portions of the respective first electrodes; wherein
the first electrodes each include an electrode body, the electrode body having the first overlapping portions and the second overlapping portions and extending in the second direction at the first height position,
the first electrodes each further include a plurality of first branches, the first branches each extending at the first height position from a corresponding one of the first overlapping portions of the electrode body so as to overlap a part of one of the second electrodes that is next to said first overlapping portion, and
each of the first branches extending from the corresponding first overlapping portions overlaps a part of one of the narrow portions that is overlapped by the same first overlapping portion.

15. A touch sensing device comprising:
a plurality of first electrodes arrayed at a first height position in spaced relation along a first direction, the first electrodes each including a plurality of first overlapping portions and a plurality of second overlapping portions;
a plurality of second electrodes arrayed at a second height position in spaced relation along a second direction and intersect the first electrodes, the second height position being different from the first height position, the second direction intersecting the first direction, the second electrodes including pairs of adjacent second electrodes, the adjacent second electrodes of each pair being located adjacent to each other in the second direction, and the second electrodes each including:
a plurality of wide portions being located at the second height position and spaced from each other in the first direction and including pairs of adjacent wide portions, the adjacent wide portions of each pair being located adjacent to each other in the first direction, and
a plurality of narrow portions being located at the second height position, the narrow portions each being smaller in dimension in the second direction than each wide portion and interconnecting the adjacent wide portions of a corresponding pair, and the narrow portions of each second electrode overlapping the corresponding first overlapping portions of the respective first electrodes; and
a plurality of first ground electrodes each being arranged at the second height position between the adjacent second electrodes of a corresponding pair so as to intersect the first electrodes, the first ground electrodes each including:
a plurality of first portions each located at the second height position between the wide portions of the adjacent second electrodes of a corresponding pair leaving narrow clearances therefrom; and
a plurality of second portions each located at the second height position between the narrow portions of the adjacent second electrodes of a corresponding pair leaving narrow clearances therefrom, the second portions overlapping the corresponding second overlapping portions of the respective first electrodes; wherein
the first electrodes each include an electrode body, the electrode body having the first overlapping portions and the second overlapping portions and extending in the second direction at the first height position,
the first electrodes each further include a plurality of first branches, the first branches each extending at the first height position from a corresponding one of the first overlapping portions of the electrode body so as to overlap a part of one of the second electrodes that is next to said first overlapping portion, and
each of the first branches extending from the corresponding first overlapping portions overlaps a part of one of the narrow portions that is overlapped by the same first overlapping portion and also overlaps a part of one of the wide portions that is contiguous to the same narrow portion.

16. The touch sensing device according to claim 6, wherein the first branches include:
a plurality of first branches that each extend from the corresponding first overlapping portions to one side of the first direction, and
another plurality of first branches that each extend from the corresponding first overlapping portions to the other side of the first direction.

17. The touch sensing device according to claim 14, wherein the first branches include:
a plurality of first branches that each extend from the corresponding first overlapping portions to one side of the first direction, and another plurality of first branches that each extend from the corresponding first overlapping portions to the other side of the first direction.

18. The touch sensing device according to claim 15, wherein the first branches include:
   a plurality of first branches that each extend from the corresponding first overlapping portions to one side of the first direction, and
   another plurality of first branches that each extend from the corresponding first overlapping portions to the other side of the first direction.

19. The touch sensing device according to claim 7, wherein the second branches include:
   a plurality of second branches that each extend from the corresponding second overlapping portions to one side of the first direction, and
   another plurality of second branches that each extend from the corresponding second overlapping portions to the other side of the first direction.

20. The touch sensing device according to claim 11, wherein the second branches include:
   a plurality of second branches that each extend from the corresponding second overlapping portions to one side of the first direction, and
   another plurality of second branches that each extend from the corresponding second overlapping portions to the other side of the first direction.

* * * * *